(12) United States Patent
Verschuuren

(10) Patent No.: US 10,220,563 B2
(45) Date of Patent: Mar. 5, 2019

(54) SILICONE RUBBER MATERIAL FOR SOFT LITHOGRAPHY

(71) Applicant: KONINKLIJKE PHILIPS N.V., Eindhoven (NL)

(72) Inventor: Marcus Antonius Verschuuren, Berkel-Enschot (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 378 days.

(21) Appl. No.: 14/697,687

(22) Filed: Apr. 28, 2015

(65) Prior Publication Data

US 2015/0239171 A1 Aug. 27, 2015

Related U.S. Application Data

(62) Division of application No. 12/993,857, filed as application No. PCT/IB2009/052276 on May 29, 2009, now Pat. No. 9,038,536.

(30) Foreign Application Priority Data

Jun. 2, 2008 (EP) ..................... 08157807

(51) Int. Cl.
  *B29C 59/00* (2006.01)
  *G03F 7/00* (2006.01)
  (Continued)

(52) U.S. Cl.
  CPC ............. *B29C 59/02* (2013.01); *B41N 1/12* (2013.01); *B82Y 10/00* (2013.01); *B82Y 40/00* (2013.01); *C08L 83/04* (2013.01); *G03F 7/0002* (2013.01); *B29K 2083/005* (2013.01); *B41C 1/08* (2013.01); *C08G 77/12* (2013.01); *C08G 77/20* (2013.01); *C08G 77/80* (2013.01); *Y10T 428/24802* (2015.01)

(58) Field of Classification Search
  None
  See application file for complete search history.

(56) References Cited

U.S. PATENT DOCUMENTS 6,106,989 A 8/2000 Bretscher
2003/0197312 A1* 10/2003 Hougham ........... B29C 35/0888
                                                        264/496

(Continued)

FOREIGN PATENT DOCUMENTS

WO  WO9844391 A1   9/1998
WO  WO9845761 A1  10/1998
WO  WO2004090938 A2  10/2004

OTHER PUBLICATIONS

Odom et al., Improved Pattern Transfer in Soft Lithography Using Composite Stamps, Langmuir 2002, 18, 5314-5320.*

*Primary Examiner* — Joshua D Zimmerman
(74) *Attorney, Agent, or Firm* — Larry Liberchuk

(57) ABSTRACT

The present invention relates to a silicone rubber like material and a printing device including a stamp layer comprising such a material. The material is suitable for use in soft lithography as it enables stable features having dimensions in the nanometer range to be obtained on a substrate, and also allows for the accommodation onto rough and non-flat substrate surfaces. The invention also relates to methods for manufacturing the silicone rubber like material and stamp layer and use thereof in lithographic processes.

5 Claims, 1 Drawing Sheet

(51) Int. Cl.
*B29C 59/02* (2006.01)
*B41N 1/12* (2006.01)
*B82Y 10/00* (2011.01)
*B82Y 40/00* (2011.01)
*C08L 83/04* (2006.01)
*B41C 1/08* (2006.01)
*C08G 77/12* (2006.01)
*C08G 77/20* (2006.01)
*C08G 77/00* (2006.01)
*B29K 83/00* (2006.01)

(56) References Cited

U.S. PATENT DOCUMENTS

2005/0238967 A1* 10/2005 Rogers et al. .................... 430/5
2010/0200146 A1* 8/2010 Zhu et al. .................... 156/62.2

* cited by examiner

SILICONE RUBBER MATERIAL FOR SOFT LITHOGRAPHY

FIELD OF THE INVENTION

The present invention relates to a silicone rubber like material and a stamp layer comprising such a material for use in soft lithography. The invention also relates to methods for manufacturing the silicone rubber like material and use thereof in lithographic processes and devices.

BACKGROUND OF THE INVENTION

In recent years, techniques for designing micrometer sized structures in electrical, optical and photonic applications have been developed. Such techniques may be based on molding and contact printing, collectively referred to as soft lithography.

Soft lithography typically makes use of a patterning device, such as a stamp comprising a transfer surface having a well defined relief pattern. Structures and features are formed upon conformal contact between the stamp transfer surface and a substrate.

In order to pattern large areas using soft lithography techniques, it is crucial that no deformation of the patterns occurs when the stamp is handled. Furthermore, it is critical that the stamp conforms to the "non-flatness" or roughness of the substrate. The characteristics of the stamp material are thus of special importance and may be critical.

Commonly used stamp materials include poly-di-methyl siloxane (PDMS) based materials, e.g. Dow Cornings Sylgard 184. Although such materials are capable of establishing reproducible conformal contact with a substrate material, they are subject to problems associated with pressure induced deformations when providing very small pattern features in the nanometer range, e.g. in the sub 100 nm range. Moreover, conventional PDMS materials are susceptible to rounding of sharp corners due to surface tension, especially when features smaller than 100 nm are molded.

One way to increase the stability of stamp materials is to increase the Young's modulus; i.e. elasticity modulus of the material. However, an increase in Young's modulus may result in that the material becomes too rigid, resulting in poor accommodation onto rough and non-flat surfaces. Hence, soft lithography is limited in resolution by the stamp material used, and for large area imprint the material needs to have a Young's modulus being high enough to generate stable features having very small dimensions, but at the same time the material must be as soft as possible to accommodate conformal contact on rough and non-flat substrates.

WO 2007/121006 discloses compositions and methods that may be used to form low thermal distortion molds. The compositions comprise a curable elastomeric silicone composition formed using a de-volatized polymer and at least one de-volatilized cross-linker. In one embodiment, the silicone composition comprises a silicone resin and an organosilicon compound having an average of at least two silicon-bonded hydrogen atoms per molecule and a catalytic amount of a hydrosilation catalyst.

A drawback in using silicone resins in transfer layers for lithographic purposes is that resins are glass like with glass transitioning temperatures ranging from room temperature to 300-400° C. The Young's modulus of such resin materials is very high (above 100-200 MPa), which may prevent conformal contact, as the stamp cannot follow the micrometer and even nanometer sized roughness of a substrate. The imprinted layer forms a rigid material, and removing the stamp requires high forces. This results in that the forces on the features in the stamp and imprinted features become very high, which may result in damage of the stamp and/or the imprinted features.

Accordingly, there is a need in the art to provide a material to be used in imprint lithography of large areas, said material being capable of providing patterns of nanoscale structures having high fidelity and good mechanical robustness while maintaining good conformal contact on rough and non-flat substrate surfaces.

SUMMARY OF THE INVENTION

An object of the present invention is to at least partly overcome the above-mentioned problems and to fulfil the need in the art.

Especially, it is an object of the present invention to provide a material suitable for use in a lithographic process, which material has a high Young's modulus enabling the imprint of features in the nanometer range, but at the same time allows for the accommodation of conformal contact on rough and non-flat substrates.

Thus, in a first aspect, the present invention relates to a silicone rubber like material comprising at least one T branched and/or Q branched (poly)siloxane precursor cross-linked by at least one linear polysiloxane, wherein said material has an Young's modulus in the range of from 7 MPa to 80 MPa.

The material according to the invention is flexible and readily conforms to a wide variety of substrates. Furthermore, it is less susceptible to deformations caused by polymerization and curing during fabrication. It is therefore suitable for use in stamp structures or patterning devices to generate lithographic patterns.

The silicone rubber like material has a Young's modulus in the range of from 7 MPa to 80 MPa. This renders the material deformable and minimizes distortion of the relief pattern, which may occur upon formation of conformal contact between the stamp surface and a substrate surface.

Accordingly, stable and reproducible features having sizes in the nanometer range; even below 10 nm may be obtained on a substrate surface; irrespectively of the surface being flat or roughened.

In a second aspect, the invention relates to a printing device having a stamp layer comprising the silicone rubber like material according to the invention. The printing device may be used in for example a lithographic process.

The printing device may be as simple as the stamp layer comprising a pattern of features.

Alternatively, the printing device may be a device having means for manipulating the stamp layer with respect to a substrate which needs to be provided with a print of the pattern of features. Such a device constitutes ad patterning device that can be used for soft lithography applications. It allows for the patterning device to be applied in a controlled manner, promotes formation of conformal contact over large areas of the substrate surface and enhances the fidelity of patterns generated on a substrate surface. Accordingly, the overall efficiency and energy consumption of the patterning process is improved.

The printing device according to the invention allows for small features to be obtained on a substrate surface without damage or altering of the features thus formed.

In another aspect, the present invention provides a method for manufacturing a silicone rubber like material having a Young's modulus in the range of from 7 MPa to 80 MPa, said method comprising:

providing a composition comprising at least one functional T branched and/or Q branched (poly)siloxane precursor adding at least one functional linear polysiloxane to said composition incubating said composition at a temperature below 100° C. to effect crosslinking of said at least one functional T branched and/or Q branched (poly)siloxane precursor by said at least one functional linear polysiloxane.

This method enables a high degree of crosslinking of the T branched (poly)siloxane precursor to be effected, resulting in silicone network structures having flexible chains. A silicone rubber like material having a Young's modulus in the range of from 7 MPa to 80 MPa can thereby be obtained, even when incubation takes place at very low incubation temperatures; e.g. below 100° C.

In embodiments, the method comprises the step of arranging a pattern in the silicone rubber like material. Preferably the pattern is a relief pattern having features with their smallest lateral dimensions smaller than 300 nm. Even more preferably they are smaller than 200 nm. Most preferably the dimensions are smaller than 100 or 50 nm.

This, typically, is effected by incubating the composition in step (c) on a master mold pattern to effect a stamp layer comprising a pattern of features.

Preferably, the composition is incubated at a temperature below 50° C.

The method according to the invention is advantageous as it does not require high incubation temperatures; i.e. curing temperatures. Disadvantages associated with high incubation temperatures are thereby avoided. For example, high incubation temperatures may result in thermal mismatch between a master pattern material and the stamp material. This is due to the build up of large stresses during heating and cooling and may result in crack formation and damage of features.

A method according to the invention has the advantage that it is relatively simple, inexpensive and has a high reproducibility which makes it suitable for mass production. The stamp layers thus formed may be used in several types of stamp structures or patterning devices.

The term 'T branched' used for definition of functional T branched polylisoxane precursor of this application means that there is within this precursor at least one Silicon atom attached to three (poly)siloxane chains. Preferably this Silicon atom is chemical bound to oxygen of each of the (poly)siloxane chains.

The term 'Q branched' used for definition of functional Q branched polylisoxane precursor of this application means that there is within this precursor at least one Silicon atom attached to four (poly)siloxane chains. Preferably this Silicon atom is chemical bound to oxygen of each of the (poly)siloxane chains.

The term 'functional' used for definition of 'functional T branched or functional Q branched polylisoxane precursor' of this application means that there is within this precursor at least one chemical group or substituent that is capable of chemical reaction under the conditions of incubation in order to provide crosslinking with the linear polysiloxane.

In one embodiment the at least one silicon atom bears the functional group.

In another embodiment at least one of the three (T branched) or four (Q branched) polysiloxane chains bears at least one and preferably one functional group. In yet another embodiment all the three (T branched) or four (Q branched) polysiloxane chains of a branched precursor bear at least one and preferably one functional groups.

Functional groups may be any of functional groups that are able to provide the chemical reaction and thus crosslinking between the functional T branched and/or Q branched polysiloxane precursor and linear polysiloxane.

In one embodiment the functional group is in the form of a vinyl group.

In embodiments of the invention, the at least one functional T branched and/or Q branched (poly)siloxane precursor is selected from the group consisting of a hydride functional T branched and/or Q branched (poly)siloxane precursor, a vinyl functional T branched and/or Q branched (poly)siloxane precursor and/or mixtures thereof.

The vinyl and/or hydride functionality improves and regulates the degree of crosslinking and results in a silicone network structure. The material thus formed is a highly flexible silicone rubber like material which has a modulus in the range of 7 MPa to 80 MPa.

To further increase the degree of crosslinking, the at least one functional linear polysiloxane is selected from the group consisting of a hydride functional linear polysiloxane, a vinyl functional linear polysiloxane and mixtures thereof.

In preferred embodiments, the at least one vinyl functional linear polysiloxane is at least 5% vinyl functional. The percentage is to be construed as meaning as it means that 30% of the silicon atoms in the linear siloxane should be hydride functional. (the same for the vinyl functional silicon atoms)

The functional vinyl groups of the linear polysiloxane(s) react with the functional T branched and/or Q branched (poly)siloxane precursor(s) which allows for a large degree of crosslinking, resulting in a silicone rubber like material having a Youngs's modulus within the ranged of 7 to 80 MPa.

In other preferred embodiments, the at least one hydride functional linear polysiloxane is least 30% hydride functional.

In embodiments, the ratio of hydride functional linear polysiloxane to vinyl functional linear polysiloxane is in the range of from 2:10 to 8:10.

By adjusting the proportion of hydride and/or vinyl functional T branched and/or Q branched (poly)siloxane precursor(s) and linear polysiloxanes, respectively, the degree of crosslinking may be varied. This is advantageous since the Young's modulus of the silicone rubber like material thus formed may be tuned to a desired value. The degree of crosslinking, and hence the Young's modulus can thereby be strictly controlled.

In yet another aspect, the invention relates to the use of a silicone rubber like material according to the above or obtainable by the above described method as a stamp layer for lithographic processes.

These and other aspects of the invention will be apparent from and elucidated with reference to the embodiment(s) described hereinafter

DETAILED DESCRIPTION OF THE INVENTION

Figure 1:
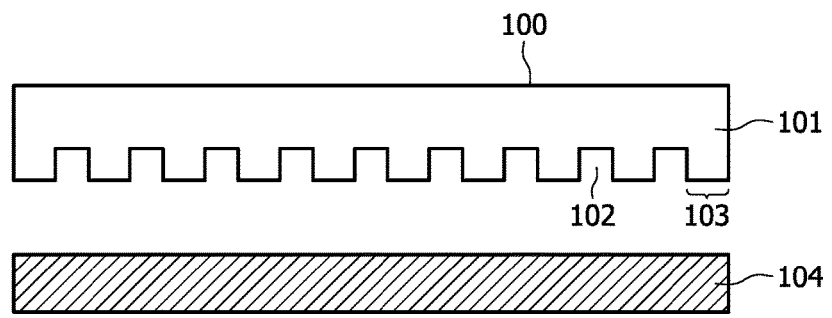
FIG. 1 is a schematic drawing of a printing device in the form of a stamp layer according to the present invention.

The present invention relates to a silicone rubber like material comprising at least one T branched and/or Q branched (poly)siloxane precursor crosslinked by at least one linear polysiloxane, wherein said material has a Young's modulus in the range of from 7 MPa to 80 MPa.

As used herein the term "T branched (poly)siloxane precursor" refers to a silicone material comprising a network of oligosiloxanes, wherein one or more silicone atoms are bound by at least three oxygen atoms to other silicone atoms. The term "Q branched (poly)siloxane precursor" refers to a silicone material comprising a network of oligosiloxanes, wherein one or more silicone atoms are bound by at least four oxygen atoms to other silicone atoms.

The T branched (poly)siloxane precursor is able to form 3-way branching chains, i.e. networks, when crosslinked by linear polysiloxanes, typically linear PDMS chains. Likewise, the Q branched (poly)siloxane precursor is able to form 4-way branching chains, i.e. networks, when crosslinked by linear polysiloxanes, typically linear PDMS chains.

The resulting silicone rubber like material according to the invention readily conforms to a wide variety of substrates, including silicon based materials, glasses and plastics. Thus, the material is very suitable for use in stamp structures or patterning devices to generate lithographic patterns.

The silicone rubber like material has a Young's modulus in the range of from 7 MPa to 80 MPa.

Hence, the material is deformable, and when used in soft lithography, it has the ability to conform to both flat and roughened surfaces. Furthermore, it allows the provision of stable and reproducible features having sizes in the nanometer range; even below 10 nm on a substrate surface.

Problems associated with rounding of sharp corner which is the case with conventional PDMS materials are thereby avoided.

When used in stamp lithography, it is crucial that the stamp material has the ability to deform substantially (e.g. between 2 and 100%), but return to the original shape when the force is removed. The silicone rubber like material according to the invention exhibits this property. Even though it has a high Young's modulus, it avoids the disadvantages of rigid or glass like materials which may show creep and deform permanently when forces are applied. The material according to the invention has a rubber like behaviour and is able to cure from a liquid into the rubber at room temperature or temperatures at which the final stamp will be used.

Furthermore, the deformability of the material minimizes distortion of the relief pattern, which may occur upon formation of conformal contact between a stamp and a substrate and also provides a more accurate replication of features. Hence, the inventive silicone rubber like material has the ability to provide stable features without resulting in creep formation.

The silicone rubber like material according to the invention is typically used above its glass transition temperature.

In a preferred embodiment, the invention relates to a printing device having a stamp layer 100 comprising the above mentioned silicone rubber like material for use in a lithographic process illustrated in FIG. 1.

The stamp layer 100 comprises a plurality of relief features 101 separated by a plurality of recessed regions 102. The patterned stamp surface layer also has a plurality of contact surfaces 103 arranged to contact the surface of a substrate 104. The relief features may have any shape desired. The smallest width of the relief features within the stamp may have dimensions in the range of 300, 200, 100, 50, and/or 25 nanometer.

The modulus of the silicone rubber like material is in the range of from 7 to 80 MPa. If the modulus is lower than 7 MPa, e.g. lower than 5 MPa, it is not possible to form features having sizes below 300 nm. On the other hand, if the modulus is too high, i.e. higher than 80 MPa, conformal contact may be impaired as the stamp cannot follow micrometer and nanometer sized roughness. This leads to high local stress which may damage the stamp and the features.

A Young's modulus in the range of from 7 to 80 MPa allows for the provision of stable features having high fidelity and sizes between 10 nm and >1 millimeter.

Stable features are obtained when the energy that is gained due to reduction in surface area is lower than the energy that is needed to deform the stamp material permanently.

The stamp layer 100 typically has a thickness within the range of 10 to 100 μm. The thickness of the patterned layer 100 preferably does not exceed 100 μm since this may result in higher bending stiffness resulting in impaired conformal contact. In contrast, if the stamp layer 100 is too thin, e.g. when used in a multi-layered stamp structure, it may be affected by the next stamp layer which usually has a lower modulus. For example, if the layer is too thin dust particles present could punch through the high modulus silicone rubber like material (which has a reduced shear to break value compared to commercial PDMS).

Accordingly, very small features on the substrate surface 104 may be obtained with the present invention without damage or altering of the features thus formed.

Typically, the distance between one feature 101 and another; i.e. the width of the recessed region 102 is at least 6 nm, e.g. between 6 and 10 nm. Such small recessed regions require a low deformation of the features to contact the substrate, and a high modulus is needed to build up the energy to release the features again.

If the distance between one feature 101 and another is too wide, the stamps may collapse upon contact with the surface of a substrate. On the other hand, if the features 101 of the stamp layer 101 are closely spaced, narrow structures tend to collapse together upon contact with a substrate surface 104 (they tend to collapse even upon release from a master pattern).

The contact surfaces 103 of the stamp layer 100 form an intimate contact with the substrate surface 104 regardless if the surface is flat or roughened. Problems associated with stamp and/or feature collapse are eliminated.

The relief features 101 are typically arranged in lines having a width of e.g. 3 to 30 nm on the stamp layer 100.

Figure 2:
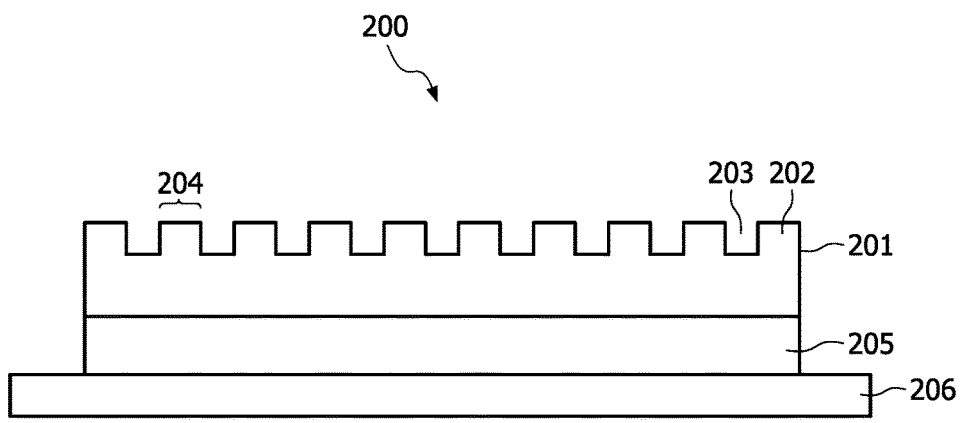
FIG. 2 is a schematic drawing of a stamp structure comprising the stamp layer according to the present invention.

In embodiments of the invention, the stamp layer may be used in a stamp structure 200 illustrated in FIG. 2.

The printing device 200 comprises a stamp layer 201 comprising the silicone rubber like material according to the invention. The stamp layer 201 comprises a plurality of features 202 and a plurality of recessed regions 203 in between, as well as contact surfaces 204 which are to form intimate contact with a substrate material.

The printing device 200 further comprises a deformable layer 205 typically formed from a PDMS like material having a low Young's modulus. The low modulus of the deformable layer 204 allows the stamp layer 201 to deform and comply to rough and non-flat surfaces without increasing the pressure on the patterned surface layer 201.

The printing device 200 may further comprise a supporting layer 206, which is typically much stiffer than the deformable and patterned layers. This supporting layer may be a thin glass sheet which prevents deformations of the deformable layers 201 and 205. Alternatively, thin plastic or metal sheets may be used.

Although, the stamp layer 201 comprising the silicone rubber like material according to the invention has a high modulus, e.g 80 MPa, the stamp still provides a very good conformal contact with a substrate surface.

Accordingly, in embodiments the invention further provides a printing device 200 for a printing process comprising a first deformable layer 205 onto which a stamp layer 201 is arranged; said stamp layer 201 comprising a silicone rubber like material having a Young's modulus of 7 MPa to 80 MPa, wherein said patterned surface layer 201 is arranged to transfer a lithographic pattern to the surface of a substrate.

The printing process may be a microcontact printing process wherein an ink of any kind of material is first applied to the stamp after which the stamp is brought in contact with a substrate in order to transfer at least part of the applied ink from the stamp to the substrate. Such inks may for example include but are not limited to curable materials, monolayer forming substances, proteins, or any other biological material. Alternatively, the printing process may be an imprinting or embossing process. The relief pattern is than transferred to a substrate by providing a substrate with an embossing material that adopts the complementary relief structure when the stamps relief structure is brought in contact with it. After curing or hardening of this embossing material the printing device is then removed from the substrate leaving it sith the relief structure that is complementary to the one on the printing device. This step may be part of a lithographic process employing further steps such as etching of any kind.

In embodiments, the present invention also provides a method for manufacturing a silicone rubber like material having a Young's modulus in the range of from 7 MPa to 80 MPa, said method comprising:

providing a composition comprising at least one functional T branched and/or Q branched (poly)siloxane precursor, adding at least one functional linear polysiloxane to said composition, incubating said composition at a temperature below 100 degrees centigrade CC.

The chemical reaction taking place during incubating preferably provides chemical crosslinking between the at least one functional T branched and/or Q branched (poly)siloxane precursor and the at least one functional linear polysiloxane to such degree that a silicone network structure results that has flexible silicone containing chains within it.

The term incubating is to be construed as meaning: giving the mixture time for chemical reaction of its constituents, in particular the at least one functional T branched and/or Q branched (poly)siloxane precursor and the at least one functional linear polysiloxane. The incubating time or working time; i.e. the time between start of mixing of a composition to be crosslinked and the reaching of the gel point, is typically between 5 and 30 minutes. However, other working times may exist depending on the conditions used during the incubating period.

In embodiments, the method comprises the step of arranging a pattern in the silicone rubber like material. Such a pattern may be arranged by any conventional patterning technique, e.g. etching or stamping from a master mold.

Preferably, a pattern is arranged by incubating the composition in step (c) on a master mold pattern to effect a stamp layer comprising a pattern of features.

The silicone rubber like material is cast on a master mold pattern; i.e. a master material comprising a plurality of recesses defining a master tool pattern, and the stamp layer, which is complementary to the master is thereafter released and removed from the master.

Typically, the material is incubated on the master over night. The materials may optionally post cure for about 2-5 more days depending on the desired hardness of the material. The material becomes harder over time.

Optionally, one or more curing catalysts may be added, e.g. a platinum (Pt) catalyst. A cyclic modulator for the platinum may optionally also be present.

Preferably, the composition is incubated at a temperature below 50° C.

This is highly desirable and avoids disadvantages associated with high incubation temperatures. For example, when curing compositions comprising conventional silicone resins having a high glass transition temperature, high curing temperatures are typically required (between 150° C. and 400° C.). For several reasons this is not desired. Thermal mismatch between the master, typically patterned silicon or quartz is so high that large stresses are built up between the stamp and the master during heating and cooling. This can lead to crack formation and damage of features. The thermal expansion coefficient of silicone resins is typically one to two orders higher (Linear CTE ~100 ppm*$K^{-1}$) than materials used on which the final features will be imprinted (e.g. silicon, quartz). Controlling the magnification error will therefore be extremely difficult.

Preferably, the at least one functional T branched (poly)siloxane is selected from the group consisting of a hydride functional T branched (poly)siloxane precursor, a vinyl functional T branched (poly)siloxane precursor or mixtures thereof. Such T branched (poly)siloxane precursor may be represented by the following formulas.

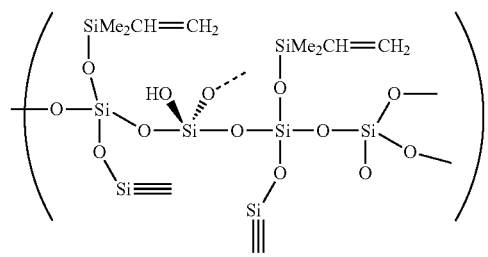

(component 1)

-continued

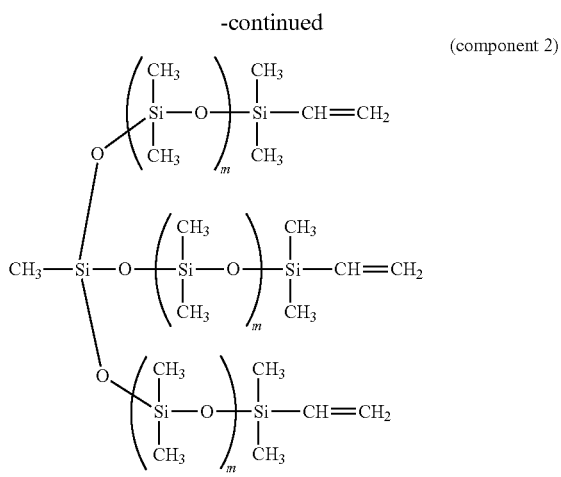

(component 2)

Vinyl Functional Q Branched (Left) and T Branched (Right) (Poly)Siloxane Precursors

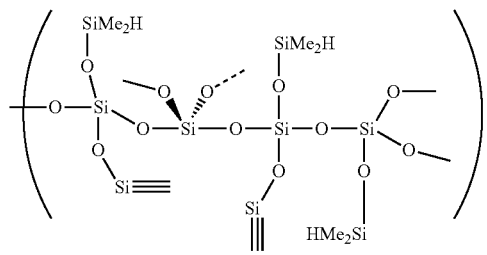

Hydride Functional Q Branched (Poly)Siloxane Precursor (HTS)

In the formula of compound 1 as well as in that of the Hydride functional T branched polysiloxane precursor, the three lines extending from the lowest two Si atoms, indicate that these Si atoms are each connected to three polysiloxane chains as is the Si atom to the far right in this compound. For the avoidance of doubt, these lines do not indicate ethylenic chemical bonds.

Optionally available Q or T branched siloxanes may include Si—OH groups, as indicated the in figure of Q branched siloxanes. These Si—OH groups could be disadvantageous as they increase the surface tension and are reactive towards other Si—OH groups which are present on silicon or glass. The Si—OH groups can optionally reactic with silanes, like mono-chloro-silanes, to attach inert or functional groups. Inert methyl groups could be attached by adding Cl—Si—[CH3]3 to the compound and letting this react under the formation on HCl, which is removed from the siloxane mix. Functional groups could be vinyl groups (from e.g. Cl—Si—[CH3]2-CH=CH2) and would increase the reactivity in the siloxane network and provide added cross linking. Other functional groups that could be attached could be fluor (from Cl—Si—[CH3]2-CH2CH2CF3) which would lower the surface tension.

The vinyl and/or hydride functionality provides a functional T or Q branched (poly)siloxane precursor with the ability to form branched chains resulting in a silicone network structure.

Preferably, the functional T and/or Q branched (poly)siloxane and the functional linear polysiloxane(s) are miscible in every proportion. T or Q branched (poly)siloxanes comprising large and bulky organic groups, e.g. phenyl modified T or Q branched (poly)siloxane, are typically not well miscible with linear methyl siloxanes. Improved miscibility provides materials with the effect of the invention. Furthermore, modifications with larger organic groups may lead to worse mechanical properties and higher surface tension. This is disadvantageous as small features thus have a tendency to stick together more easily.

Hence, in preferred embodiments, the at least one functional T or Q branched (poly)siloxane is a functional T or Q branched (poly) methyl siloxane.

When the vinyl functional Q branched (poly)siloxane component 1 is used, mono-chlorosilanes may be added to passivate the Si—OH group or modify the system with fluoro end groups.

To further increase the branching of the T or Q branched (poly)siloxane precursor, the at least one functional linear polysiloxane is selected from the group consisting of a hydride functional linear polysiloxane, a vinyl functional linear polysiloxane or mixtures thereof. Such linear polysiloxanes may be represented by:

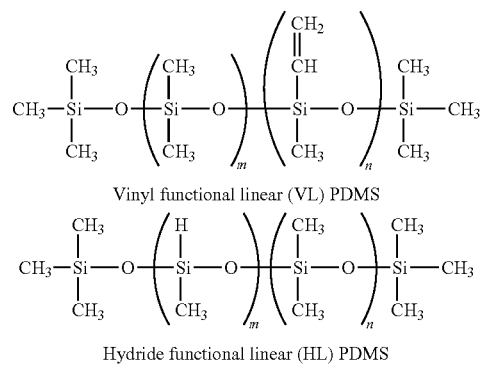

Vinyl functional linear (VL) PDMS

Hydride functional linear (HL) PDMS

The ratio of m to n of the vinyl functional PDMS is typically in the range of from 20:1 to 10:1 e.g. from 13:1 to 11:1. The molecular weight is in the range of from 800 to 40000 Da, e.g. from 1000 to 30 000.

The ratio of m to n of the hydride functional PDMS is typically in the range of from 1:4 to 1:1. The molecular weight is in the range of from 800 to 40000 Da, e.g. from 1000 to 30 000, preferably from 1000 to 20000 Da.

In preferred embodiments, the at least one vinyl functional linear polysiloxane is at least 5% vinyl functional. Typically, the vinyl functional polysiloxane is 6-8% vinyl functional.

When hydride functional linear polysiloxanes are used, these are typically at least 30% hydride functional, e.g. between 30 and 50% hydride functional with respect to the silicon atoms in the precursor. These ranges provide a material with a large degree of crosslinking and a silicone rubber like material suitable for use in soft lithography.

Accordingly, the proportion of the vinyl and hydride parts of both the T branched (poly)siloxane precursors and the linear polysiloxanes may be varied; and thus also the degree of crosslinking. This allows for the modulus of the material to be tuned to a desired value; typically between 7 MPa and 80 MPa.

Preferably, the ratio of hydride functional linear polysiloxane to vinyl functional linear polysiloxane is in the range of from 2:10 to 8:10, preferably in the range of from 5:10 to 6:10.

Accordingly, a silicone rubber like material having a high modulus is obtained even at curing temperatures as low as 50° C.

Table 1 below exemplifies the modulus adjustability in preparing the silicone rubber like material according to the invention by combining different parts of vinyl and hydride functional T branched (poly)siloxane precursor, and polysiloxanes, respectively.

TABLE 1

Young's modulus variability

| Vinyl part I (VL) | Vinyl part II | | Hydride part | | | Young's modulus (MPa) |
|---|---|---|---|---|---|---|
| | Component 1 | Component 2 | HL 30% | HL 50% | HTS | |
| 1.7 | | | 0.5 | | | 5.7 |
| 1.7 | | | | 0.3 | | 7.4 |
| 1.7 | | | | | 0.25 | 5.11 |
| 1.4 | 0.3 | | | 0.62 | | 12 |
| 1.3 | 0.4 | | | 0.62 | | 21 |
| 1 | 0.5 | | 0.724 | | | 16.1 |
| 1 | 0.5 | | | 0.58 | | 21.3 |
| 1 | 0.625 | | | 0.65 | | 21.5 |
| 1 | 0.625 | | | 0.585 | | 40.5 |
| 1 | 0.625 | | | 0.536 | | 36.5 |
| 1 | 0.625 | | 0.813 | | | 28.5 |
| 1 | 0.625 | | | 0.585 | | 59.8 |
| 1 | 0.125 | 0.375 | | 0.45 | | 16.3 |
| 1 | 0.706 | | | 0.553 | | 80.0 |
| 1 | 0.800 | | | 0.585 | | 80.0 |

All parts are parts by weight. Curing temperature 50° C.

Since the stamp layers may be produced from a master pattern it is highly suitable for mass production. Furthermore, it is relatively simple, inexpensive and has a high reproducibility. The patterned layers thus formed may be used in several types of stamp structures or patterning devices.

The silicone rubber like material according to the present invention may be used in several applications, such as soft lithography in general, e.g. imprint lithography, phase shift lithography, micro contact printing etc.

Examples of printing devices are well described in embodiments of WO 2003/099463, US 2004/0197712 US 2004/0011231 and the non-prepublished international patent application IB2007/054888, of which the contents are incorporated by reference. The person skilled in the art will find detailed description in these references on how to make an imprint device that uses a flexible stamping or printing device with a rubber like material according to the present invention. Such a device will be capable of providing small features to a substrate by using the printing, microcontact printing, imprinting or lithographic imprinting processes described in those references.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. For example, the silicone rubber like material or the stamp layer are not limited to a specific stamp structure, but may be used in any type of stamp or patterning device.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that the combination of these measures cannot be used to advantage.

The invention claimed is:

1. A printing device comprising:
a first patterned stamp layer; and
a second, deformable layer, wherein
the first patterned stamp layer having a patterned external contact surface and an internal surface in direct contact with the second layer,
the first layer comprises a silicone rubber like material comprising at least one Q branched and/or T branched (poly)siloxane crosslinked by at least one linear polysiloxane, wherein the silicone rubber like material has a Young's modulus in a range of 7 MPa to 80 MPa, wherein the silicone rubber like material is crosslinked at a temperature below 50° C. and
the second layer comprises a deformable material having a low Young's modulus as compared to that of the silicone rubber like material.

2. The printing device according to claim 1 wherein the external surface of the first layer comprises a pattern of features.

3. A patterned stamp layer comprising:
a silicone rubber like material having a Young's modulus in the range of from 7 MPa to 80 MPa, the material comprising at least one functional linear polysiloxane crosslinked to at least one functional T branched and/or functional Q branched (poly)siloxane, wherein the silicone rubber like material is crosslinked at a temperature below 50° C. and wherein
the at least one functional T branched (poly)siloxane is formed from precursors including hydride functional T branched (poly)siloxane precursors, vinyl functional T branched (poly)siloxane precursors, and mixtures thereof,
the at least one functional Q branched (poly)siloxane is formed from precursors including hydride functional Q branched (poly)siloxane precursors, vinyl functional Q branched (poly)siloxane precursors and mixtures thereof,
the at least one functional linear polysiloxane is selected from the group consisting of a hydride functional linear polysiloxane, a vinyl functional linear polysiloxane and mixtures thereof, and
when the at least one functional linear polysiloxane is a mixture of vinyl functional and hydride functional linear polysiloxanes, a ratio of hydride functional linear polysiloxane to vinyl functional linear polysiloxane is in a range of from 2:10 to 8:10.

4. The patterned stamp layer of claim 3, wherein the patterned stamp layer is suitable for use in an imprint lithographic process.

5. The patterned stamp layer of claim 3, wherein the functional T and/or Q branched (poly)siloxanes and the functional linear polysiloxanes are miscible.

* * * * *